United States Patent
Robinson et al.

(10) Patent No.: US 7,061,953 B2
(45) Date of Patent: Jun. 13, 2006

(54) CALIBRATION OF LASER SYSTEMS

(76) Inventors: Michael A. Robinson, 40647 Canyon Heights Dr., Fremont, CA (US) 94539; Gideon Z. Romm, 1925 Eastchester Rd., Apt. 1A, Bronx, NY (US) 10461; Randall P. Clark, 7036 Hollow Lake Way, San Jose, CA (US) 95120; Frederick W. Miller, 920 Desert Isle Dr., San Jose, CA (US) 95117

( * ) Notice: Subject to any disclaimer, the term of this patent is extended or adjusted under 35 U.S.C. 154(b) by 0 days.

(21) Appl. No.: 11/044,399

(22) Filed: Jan. 26, 2005

(65) Prior Publication Data

US 2005/0190804 A1    Sep. 1, 2005

Related U.S. Application Data

(62) Division of application No. 10/340,174, filed on Jan. 10, 2003, now Pat. No. 6,891,866.

(51) Int. Cl.
*H01S 3/00*    (2006.01)
*H01S 3/13*    (2006.01)

(52) U.S. Cl. ........................... 372/38.1; 372/29.01
(58) Field of Classification Search .......... 372/29.015, 372/38.1, 38.02, 38.07
See application file for complete search history.

(56) References Cited

U.S. PATENT DOCUMENTS

| | | | |
|---|---|---|---|
| 5,625,616 A | * | 4/1997 | Koike et al. ............. 369/53.26 |
| 5,844,928 A | * | 12/1998 | Shastri et al. ............ 372/38.02 |
| 2002/0114363 A1 | * | 8/2002 | Everett ........................ 372/33 |

* cited by examiner

Primary Examiner—Don Wong
Assistant Examiner—Leith A. Al-Nazer

(57) ABSTRACT

A method for determining a condition of the laser system includes determining a change in a laser current from a preset value. The method includes determining the preset value based on a temperature signal and a supply voltage signal for the laser. The preset value can be determined from a table or from a function.

8 Claims, 16 Drawing Sheets

| Initial Iavg | Temp | Vcc |
|---|---|---|
| | | |

~48

| Ibias | Imod | Iavg | OMA | P₁ | P₀ | Pavg_tx | EX |
|---|---|---|---|---|---|---|---|
| | | | | | | | |

⌒46

~51

| IMON | Transmitted Power |
|---|---|
| | |

~50

| RX_OMA | Received OMA |
|---|---|
| | |

~52

| IPINAVG | Avg Received Power |
|---|---|
| | |

~53

| Actual ADC Output | Temp | Vcc | Compensated ADC Output |
|---|---|---|---|
| | | | |

~54

| Temp | Vcc | Offset | Gain |
|---|---|---|---|
| | | | |

~56

| Desired DAC Output | Temp | Vcc | DAC Input |
|---|---|---|---|
| | | | |

~58

| Temp | Vcc | Offset | Gain |
|---|---|---|---|
| | | | |

CALIBRATION OF LASER SYSTEMS

This application is a divisional of application Ser. No. 10/340,174, now U.S. Pat. No. 6,891,866, filed on Jan. 10, 2003.

FIELD OF INVENTION

This invention relates to control and calibration of laser transmitters, receivers, and transceivers.

DESCRIPTION OF RELATED ART

Laser transceivers are commonly used to transmit and receive data in optical networks. Parameters such as the laser drive current, the transmitted power, and the received power must be calibrated so the laser transceivers conform to established standards. Thus, what are needed are methods and apparatuses that enhance the calibration of the laser transceivers.

SUMMARY

In accordance with one aspect of the invention, a method for a laser system to determine a condition of the laser system includes generating a temperature signal corresponding to a temperature of a laser, determining a present value of a current to the laser, determining an initial value of the current from at least the temperature signal, and determining a change in the current. The change in the current indicates the condition of the laser system.

BRIEF DESCRIPTION OF THE DRAWINGS

FIG. 3A illustrates tables stored in a memory in the laser system of FIG. 1 in one embodiment.

DETAILED DESCRIPTION

Figure 1:
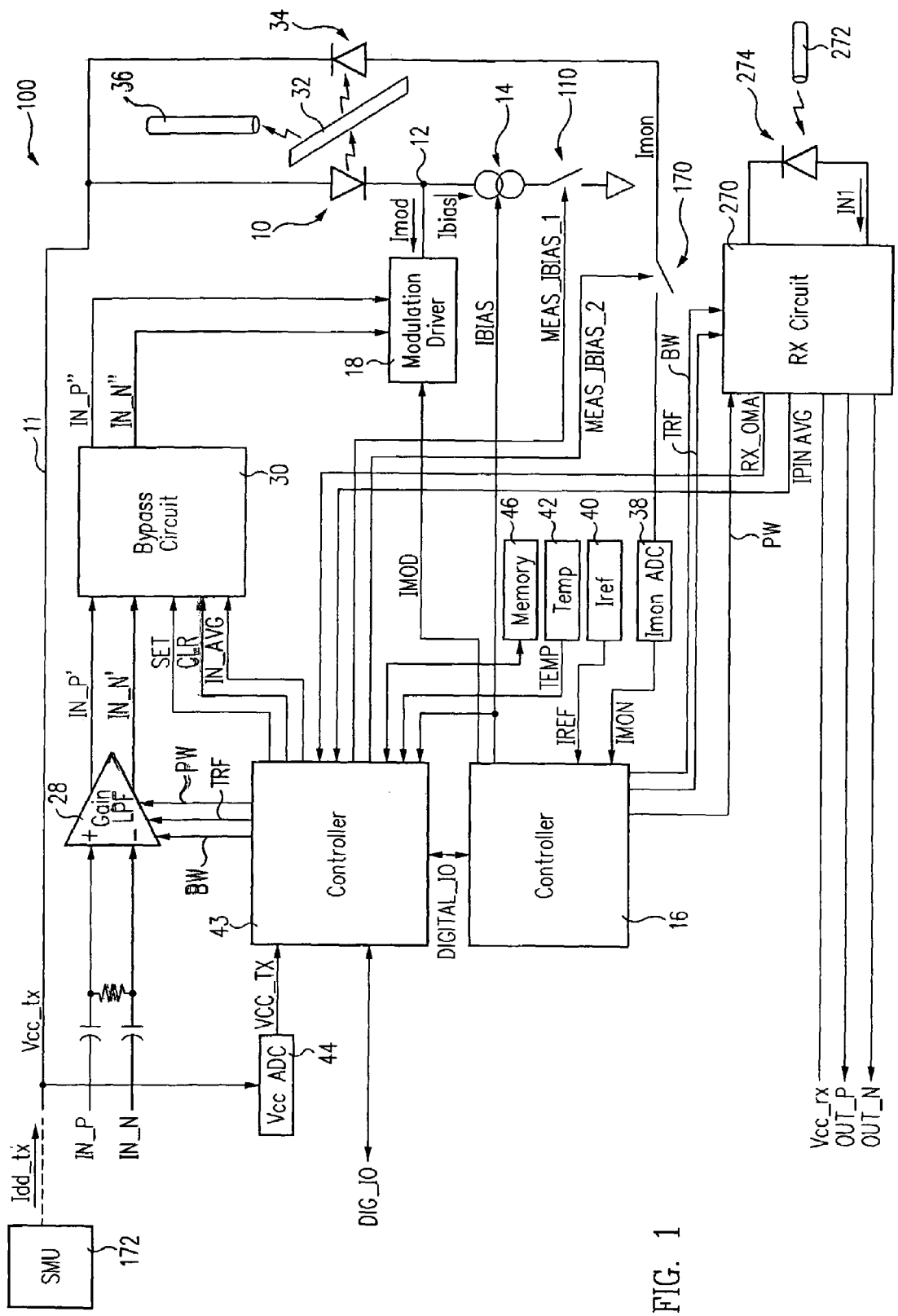
FIG. 1 is a schematic of a laser system in accordance with one embodiment of the invention.

FIG. 1 illustrates a laser system 100 (e.g., a laser transceiver) in one embodiment of the invention. The anode of a laser 10 (e.g., a laser diode) is connected to a supply rail 11 that provides a power supply voltage Vcc_tx and a power supply current Idd_tx. The cathode of laser diode 10 is connected at a node 12 to a current source 14 that sinks a constant current Ibias from laser diode 10. A controller 16 sets the magnitude of current Ibias by outputting a control signal IBIAS to current source 14. Control signal IBIAS can be an analog signal or a digital signal having multiple bits.

Figure 2:
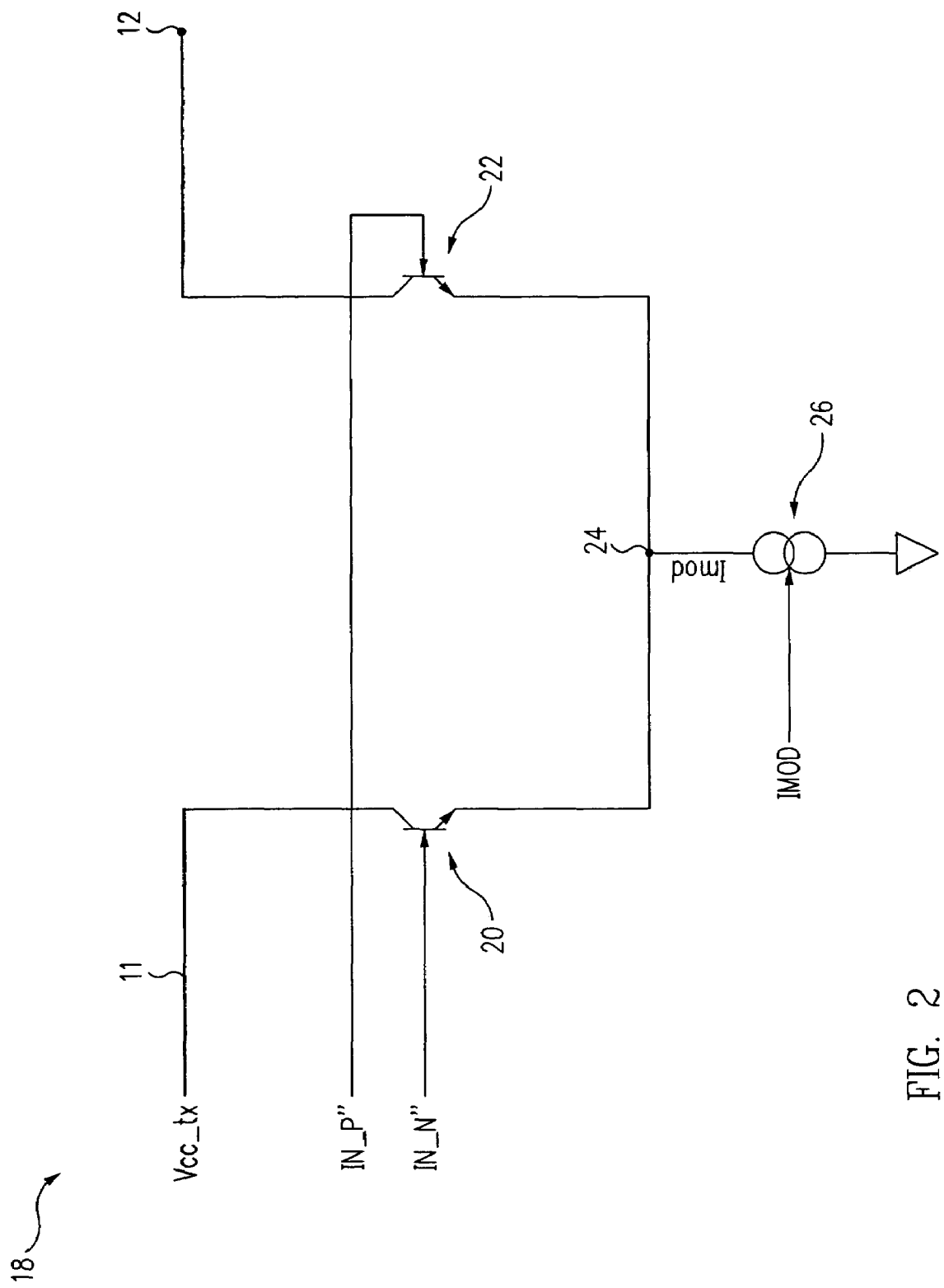
FIG. 2 is a schematic of a modulation driver that provides a current Imod to a laser in the laser system of FIG. 1 in one embodiment.

The cathode of laser diode 10 is also connected at node 12 to a modulation driver 18 that sinks a modulation current Imod from laser diode 10. FIG. 2 illustrates one embodiment of modulation driver 18. Bipolar transistors 20 and 22 have their emitter terminals tied to a node 24. A current source 26 sinks current Imod from node 24. Transistor 20 has its collector terminal connected to supply rail 11 to receive current. Transistor 22 has its collector terminal connected at node 12 to the cathode of laser diode 10. Transistors 20 and 22 form a differential pair that selectively allows current source 26 to sink current Imod from laser diode 10. Controller 16 sets the magnitude of current Imod by outputting a control signal IMOD to current source 26. Control signal IMOD can be an analog signal or a digital signal having multiple bits. The drive current applied to laser diode 10 is either current Ibias or the sum of currents Ibias and Imod. The average drive current applied to laser diode 10 (hereafter "current Iavg") is Ibias+(Imod/2).

Figure 3:
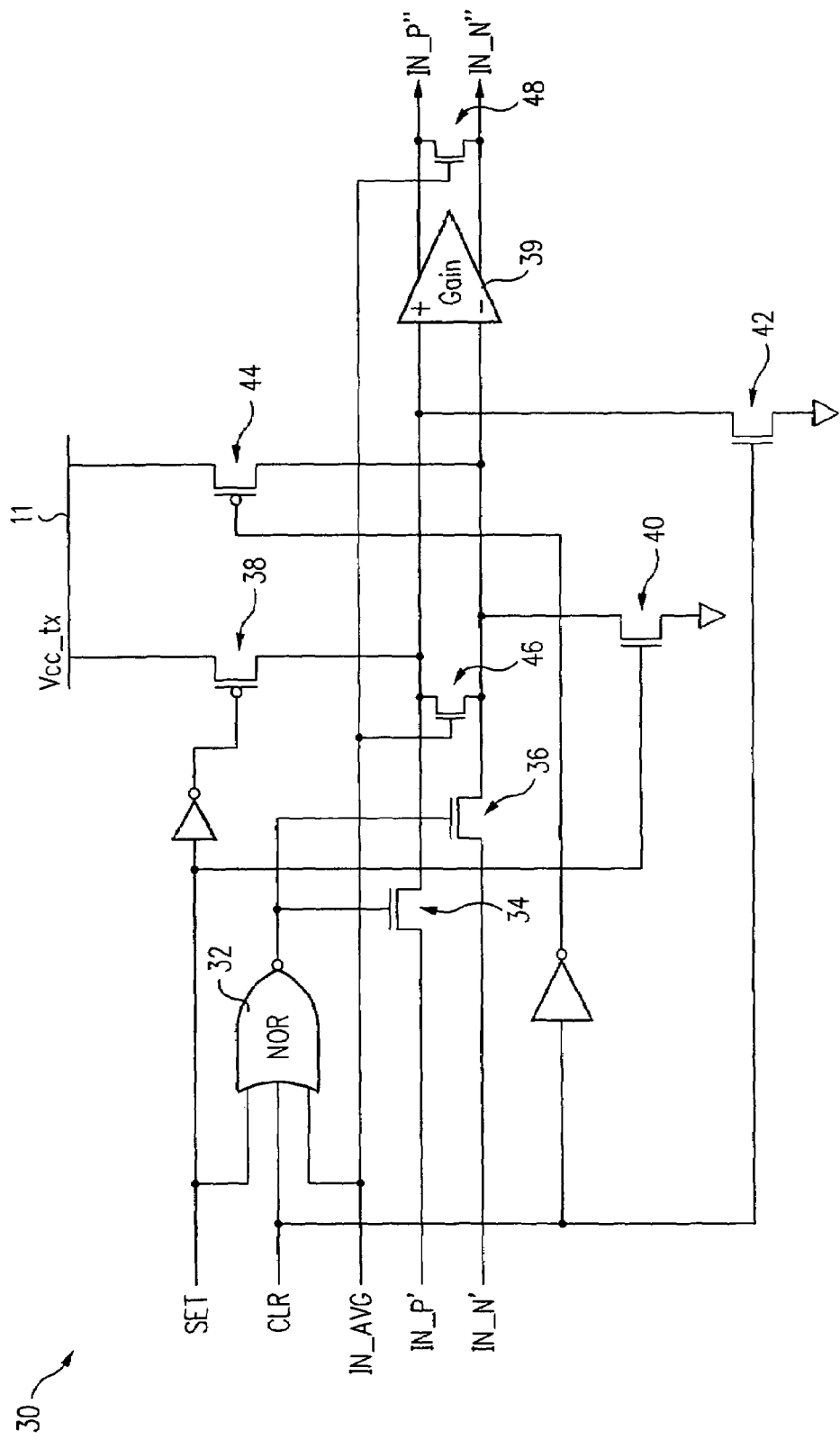
FIG. 3 is a schematic of a bypass circuit in the laser system of FIG. 1 in one embodiment.

An amplifier 28 (FIG. 1) receives data signal IN_P and its complement IN_N to be transmitted by laser diode 10. In response, amplifier 28 outputs amplified signals IN_P' and IN_N' to a bypass circuit 30. FIG. 3 illustrates one embodiment of bypass circuit 30. By default, bypass circuit 30 outputs signals IN_P' and IN_N' as control signals IN_P" and IN_N" to transistors 20 and 22 (FIG. 2) of modulation driver 18. The purpose and operation of bypass circuit 30 are described later in one aspect of the invention.

A mirror 32 (FIG. 1) reflects a part of the light signal from laser diode 10 to a light detector 34 (e.g., a photodiode) and transmits a part of the light signal to a fiber 36 that carries the light signal to another component. Photodiode 34 is connected between supply rail 11 and an Imon ADC (analog-to-digital converter) 38. Photodiode 34 outputs an analog signal Imon to Imon ADC 38. Analog signal Imon is proportional to the reflected power received by photodiode 34. The reflected power is proportional to the transmitted power received by fiber 36 and the total output power of laser diode 10. Imon ADC 38 outputs a digital signal IMON to controller 16.

An Iref source 40 outputs a reference signal IREF to controller 16. Reference signal IREF can be either digital or analog. Controller 16 typically compares signals IREF and IMON to control laser diode 10 in a closed feedback loop.

A temperature sensor 42 outputs a signal TEMP to a controller 43. Signal TEMP can be either digital or analog. Signal TEMP is proportional to the temperature of laser diode 10.

A Vcc ADC 44 is connected to supply rail 11 and outputs a digital signal VCC_TX to controller 43. Signal VCC_TX is proportional to supply voltage Vcc_tx supplied to laser diode 10.

A memory 46 (FIGS. 1 and 3A) outputs parameters for calibrating laser system 100 to controller 43. Memory 46 may be a programmable nonvolatile memory such as an EEPROM. Controller 43 communicates with a host on a bus DIG_IO and with controller 16 on a bus DIGITAL_IO. The host can be an external processor, computer, or a test equipment.

Based on the difference between signals IREF and IMON, controller 16 can adjust current Iavg so laser diode 10 generates a constant output power over a range of temperatures and power supply voltages. As laser diode 10 degrades, controller 16 typically increases current Iavg to maintain the constant output power. The difference between the present and the initial values of current Iavg for any given temperature and supply voltage may indicate a degradation or a malfunction of laser diode 10.

Figure 4:
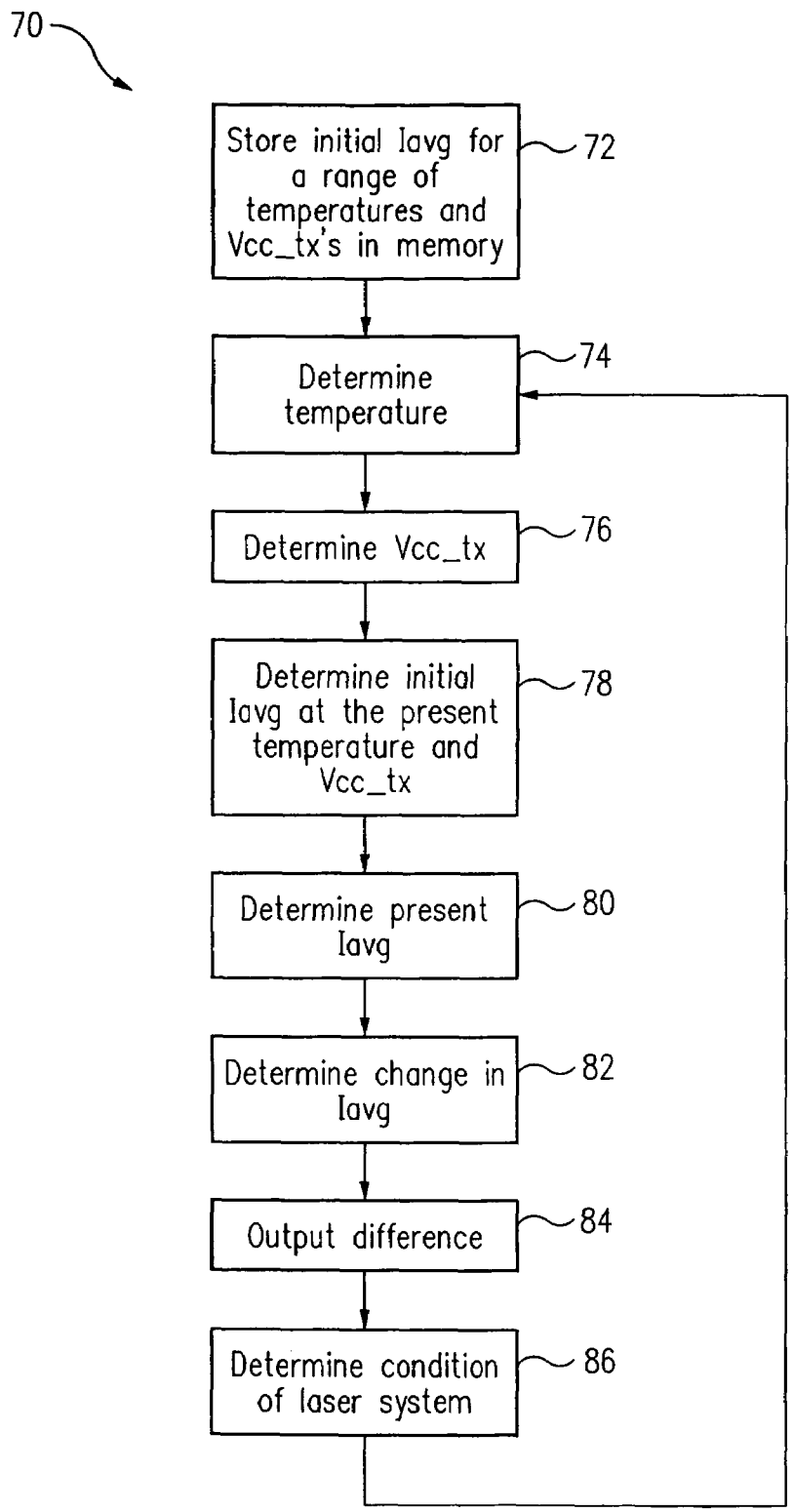
FIG. 4 is a flow chart of a method to determine a degradation or a malfunction of the laser system of FIG. 1 in one embodiment.

In accordance with one aspect of the invention, the difference between the present and the initial values of current Iavg is determined to indicate the degradation or malfunction of laser diode 10. FIG. 4 is a flowchart of a method 70 implemented by controller 43 to determine the change in current Iavg in one embodiment.

In step 72, the initial values of current Iavg for a range of temperatures and supply voltages are stored in a table 48 (FIG. 3A) in memory 46. The initial values are experimentally determined to generate a constant power over different temperatures and supply voltages when laser system 100 is first manufactured. Instead of a table 48, a function correlating the initial values of current Iavg to different temperatures and supply voltages can be extrapolated from experimental data and stored in memory 46. Typically, current Iavg is more dependent on the temperature than the supply voltage.

In step 74, controller 43 determines the present temperature of laser diode 10 by reading signal TEMP from temperature sensor 42.

In step 76, controller 43 determines the present supply voltage Vcc_tx to laser system 100 by reading signal VCC_TX from Vcc ADC 44.

In step 78, controller 43 determines an initial value of current Iavg at the present temperature and supply voltage. Controller 43 can look up the initial value of current Iavg in table 48. Alternatively, controller 43 can calculate the initial value of current Iavg at the present temperature and supply voltage using the function extrapolated from experimental data.

In step 80, controller 43 determines the present value of current Iavg. Controller 43 receives the present value of current Iavg from the values of control signals IBIAS and IMOD from controller 16. As described above, current Iavg is equal to currents Ibias+Imod/2. Thus, control signals IBIAS and IMOD can be correlated to the value of current Iavg.

In step 82, controller 43 determines the change in current Iavg. Controller 43 can calculate the difference between the present and the initial values of current Iavg. Alternatively, controller 43 can calculate the ratio between the present and the initial values of current Iavg.

In step 84, controller 43 outputs the difference or the ratio to the host on bus DIG_IO.

In step 86, the host uses the difference or the ratio to determine the condition of laser diode 10. From experimental data, the host can determine when the change in current Iavg indicates a need to replace laser diode 10. In addition, the change in current Iavg can indicate a malfunction of laser diode 10 or laser system 100 if the change increases much faster than expected.

Referring back to FIG. 1, laser system 100 may include a switch 110 between current source 14 and another supply rail (e.g., the ground). Controller 43 outputs a control signal MEAS_IBIAS_1 to the control terminal of switch 110. When switch 110 is open, current source 14 does not have a current path to the ground and is thus turned "off." When current source 14 is turned off, laser diode 10 does not draw any current from supply rail 11 because the current path to the ground is broken. Assuming modulation current Imod is turned off and all the other components are kept in a steady state, current Ibias can be determined by measuring the difference in supply current Idd_tx to laser system 100 when current source 14 is on and off. For the measurement of current Ibias to be accurate, current source 14 must draw the same amount of current from supply rail 11 whether or not laser diode 10 draws current from supply rail 11.

Figure 5:
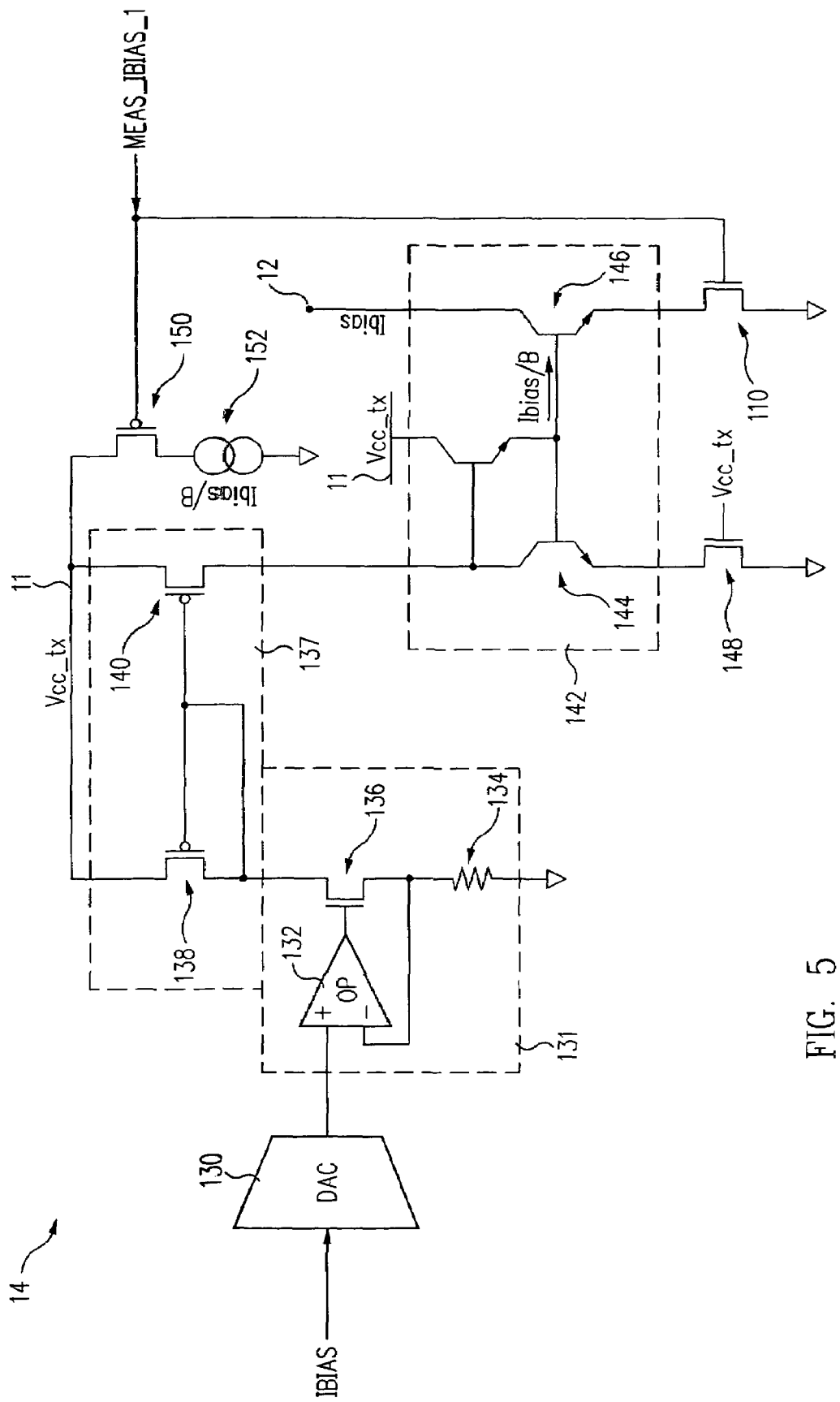
FIG. 5 is a schematic of a current source that provides a current Ibias to a laser in the laser system of FIG. 1 in one embodiment.

FIG. 5 illustrates one embodiment of current source 14. A DAC (digital-to-analog converter) 130 receives control signal IBIAS from controller 43 and outputs a voltage signal to a voltage-to-current (V/I) converter 131. V/I converter 131 includes an operational amplifier 132 that outputs an amplified voltage signal, set by resistor 134, to the gate of an NMOS transistor 136. Transistor 136 sinks a first reference current from a current mirror 137 formed by PMOS transistors 138 and 140 that are pulled up to supply rail 11. Current mirror 137 mirrors the first reference current and sources a second reference current to a current mirror 142 formed by bipolar transistors 144 and 146 that are pulled down to the ground. Current mirror 142 mirrors the second reference current and sinks current Ibias at node 12 from laser diode 10. Switch 110 (e.g., a NMOS transistor) is coupled between the emitter terminal of transistor 146 and the ground. When transistor 110 is turned off, current mirror 142 does not sink current Ibias from laser diode 10. For matching purposes, a permanently on NMOS transistor 148 is also coupled between the emitter terminal of transistor 144 and the ground.

To ensure that current source 14 draws a constant current from supply rail 11, an PMOS transistor 150 is coupled between supply rail 11 and a current source 152. Controller 43 outputs control signal MEAS_IBIAS_1 to the gate of transistor 150. Current source 152 sinks a current Ibias/B from supply rail 11 when transistor 110 decouples the emitter terminal of transistor 146 from the ground. Current Ibias/B is the base leakage current drawn by bipolar transistor 146 when it conducts. Thus, current source 14 draws the same amount of current from supply rail 11 whether or not laser diode 10 draws current from supply rail 11.

Referring back to FIG. 1, laser system 100 may include a switch 170 that couples photodiode 34 and Imon ADC 38. Controller 43 outputs a control signal MEAS_IBIAS_2 to the control terminal of switch 170. When switch 170 is open, photodiode 34 does not draw any current from supply rail 11 and is thus turned "off."

Figure 6:
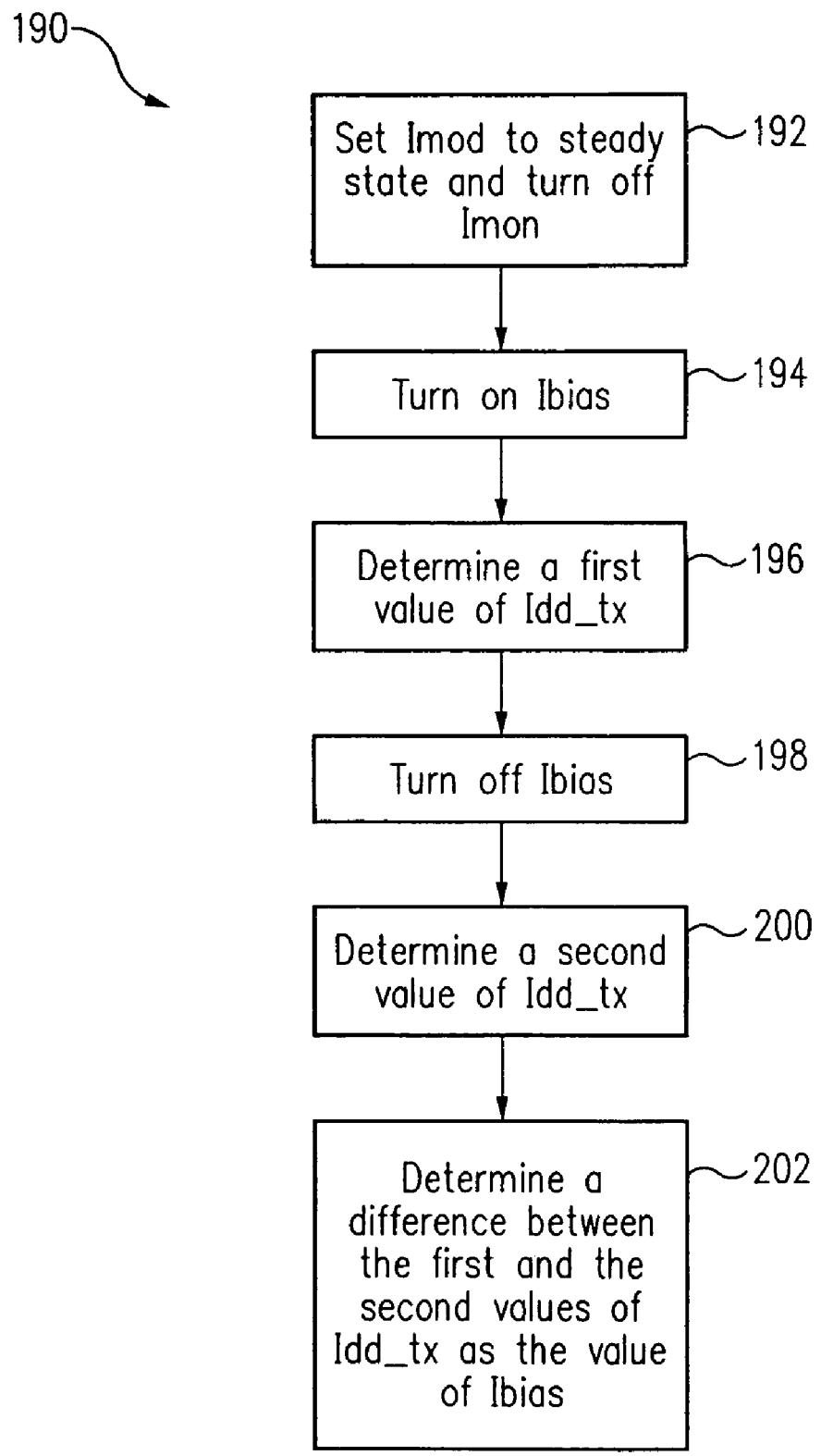
FIG. 6 is a flow chart of a method to measure current Ibias applied to a laser in the laser system of FIG. 1 in one embodiment.

In accordance with one aspect of the invention, current source 14 is turned on and off so supply current Idd_tx to laser system 100 can be measured to determine the value of current Ibias. FIG. 6 is a flowchart of a method 190 implemented by controller 43 to measure current Ibias in one embodiment. In method 190, an external source measurement unit (SMU) 172 (FIG. 1) is connected to supply rail 11 to provide power to laser system 100.

In step 192, controller 43 sets modulation driver 18 in a steady state so it draws a constant current from supply rail 11. Controller 43 can set modulation driver 18 to be constantly on or off using bypass circuit 30 (described later) and cause controller 16 to set control signal IMOD to its lowest value. Controller 43 can also turn off photodiode 34 by opening switch 170 (FIG. 1).

In step 194, controller 43 closes switch 110 (FIG. 1) to turn on current source 14 and then instructs controller 16 to set control signal IBIAS to provide current Ibias to laser diode 10.

In step 196, SMU 172 measures a first value of supply current Idd_tx to laser system 100.

In step 198, controller 43 opens switch 110 to turn off current source 14 so laser diode 10 does not draw any current from supply rail 11. In addition, controller 43 closes transistor 150 (FIG. 5) so current source 14 continues to draw the same amount of current from supply rail 11.

In step 200, SMU 172 measures a second value of the supply current Idd_tx.

In step 202, a difference between the first and the second values of supply current Idd_tx is determined The difference is the value of current Ibias supplied to laser diode 10.

Referring back to FIGS. 1 and 3, laser system 100 may include bypass circuit 30 controlled by signals SET, CLR, and IN_AVG according to the following truth table.

| SET | 0 | 1 | 0 | 0 |
|---|---|---|---|---|
| CLR | 0 | 0 | 1 | 0 |
| IN_AVG | 0 | 0 | 0 | 1 |
| IN_P" | IN_P' | 1 | 0 | Signal IN_P"= Signal IN_N" |
| IN_N" | IN_N' | 0 | 1 | Signal IN_P"= Signal IN_N" |

When any one of signals SET, CLR, and IN_AVG is high, a NOR gate 32 turns off transistors 34 and 36 to decouple input signals IN_P' and IN_N' from output signals IN_P'" and IN_N."

When only signal SET is high, a transistor 38 couples the non-inverted terminal of an amplifier 39 to supply rail 11 while a transistor 40 couples the inverted terminal of amplifier 39 to the ground. This causes amplifier 39 to output a high signal IN_P'" and a low signal IN_N." Controller 43 brings signal SET high to cause modulation driver 18 to constantly supply current Imod to laser diode 10. This may be used so a transmitted power P1 that represents a logical HIGH can be measured.

When only signal CLR is high, a transistor 42 couples the non-inverted terminal of amplifier 39 to the ground while a transistor 44 couples the inverted terminal of amplifier 39 to supply rail 11. This causes amplifier 39 to output a low signal IN_P'" and a high signal IN_N." Controller 43 brings control signal CLR high to cause modulation driver 18 to stop supplying current Imod to laser diode 10. This may be used so a transmitted power P0 that represents a logical LOW can be measured.

When only signal IN_AVG is high, a transistor 46 shorts the input terminals of amplifier 39 together while a transistor 48 shorts the output terminals of amplifier 39 together. This causes amplifier 39 to output signals IN_P' and IN_N' having the same voltage value. Controller 43 brings control signal IN_AVG high to cause modulation driver 18 to constantly supply half of current Imod to laser diode 10. This may be used so the average transmitted power Pavg_tx can be measured.

Figure 7:
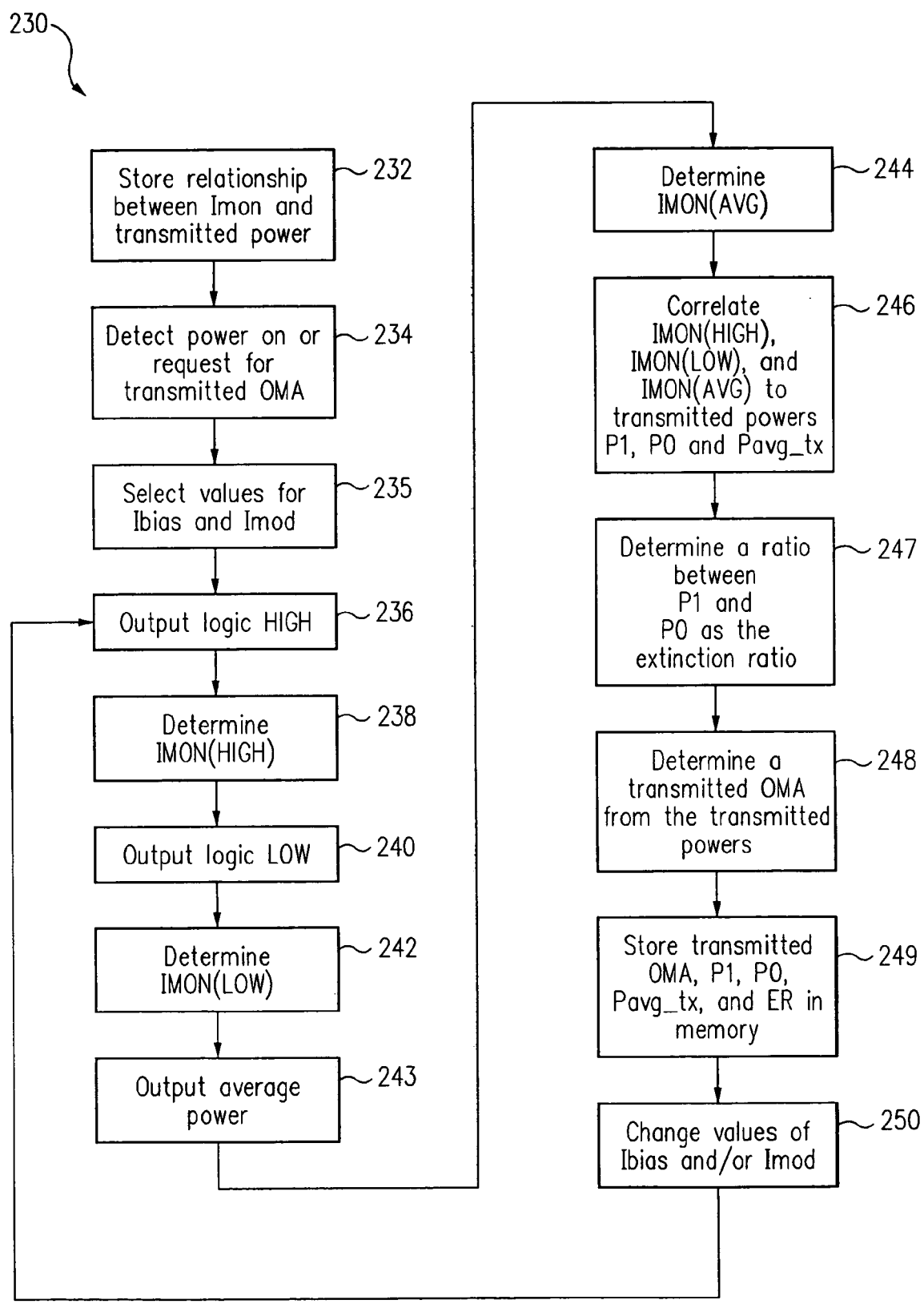
FIG. 7 is a flow chart of a method to measure transmitted powers from the laser system of FIG. 1 in one embodiment.

In accordance with one aspect of the invention, current Imod is selectively supplied to laser diode 10 so that a transmitted OMA (optical modulation amplitude), an extinction ratio, and transmitted powers P1, P0, and Pavg_tx can be measured. FIG. 7 is a flowchart of a method 230 implemented by controller 43 to measure these characteristics in one embodiment.

In step 232, transmitted powers corresponding to values of signal IMON are stored in a table 50 (FIG. 3A) in memory 46. The transmitted powers are experimentally measured with an optical meter for the corresponding values of signal IMON. Instead of table 50, a function correlating the values of signal IMON to the transmitted powers can be extrapolated from experimental data and stored in memory 46.

In step 234, controller 43 detects that laser system 100 is powering on. Alternatively, controller 43 receives a request from the host to measure any one of transmitted OMA, extinction ratio, and transmitted powers P1, P0, and Pavg_tx.

In step 235, controller 43 instructs controller 16 to set the initial values of current Ibias and Imod for the calibration process.

In step 236, constant currents Ibias and Imod are applied to laser diode 10 to generate transmitted power P1. To do so, controller 43 brings signal SET high so modulation driver 18 provides a constant current Imod to laser diode 10.

In step 238, controller 43 reads the value of signal IMON (hereafter "signal IMON(HIGH)") in response to the constant currents Ibias and Imod.

In step 240, constant current Ibias is applied to laser diode 10 to generate transmitted power P0. To do so, controller 43 brings signal CLR high and signal SET low so modulation driver 18 does not provide a modulated current Imod to laser diode 10.

In step 242, controller 43 reads the value of signal IMON (hereafter "signal IMON(LOW)") in response to the constant current Ibias.

In step 243, half of current Imod is applied to laser diode 10 to generate transmitted power Pavg_tx. To do so, controller 43 brings signal IN_AVG high and signal CLR low so modulation driver 18 provides half of current Imod to laser diode 10.

In step 244, controller 43 reads the value of signal IMON (hereafter "signal IMON(AVG)") in response to current Ibias and half of current Imod.

In step 246, controller 43 correlates the values of signals IMON(HIGH), IMON(LOW), and IMON(AVG) to transmitted powers P1, P0, and Pavg_tx at the present drive current. Controller 43 can look up the values of transmitted powers P1, P0, and Pavg_tx in table 50 based on the values of signals IMON(HIGH), IMON(LOW), and IMON(AVG). Alternatively, controller 43 can calculate the transmitted powers P1, P0, and Pavg_tx using the function extrapolated from experimental data.

In step 247, controller 43 determines a ratio of power P1 to power P0. This ratio is the extinction ratio of the transmitted powers at the present drive currents.

In step 248, controller 43 determines the difference between transmitted powers P1 and P0. The difference is the transmitted OMA of laser diode 10 at the present drive current.

In step 249, controller 43 stores the transmitted OMA, transmitted powers P1, P0, and Pavg_tx, and the extinction ratio for the present currents Ibias and Imod in a table 51 (FIG. 3A) in memory 46. Controller 43 can also output the transmitted OMA, the extinction ratio, and transmitted powers P1, P0, and Pavg_tx to the host on bus DIG_IO.

In step 250, controller 43 instructs controller 16 to change current Ibias and/or current Imod. Step 250 is followed by step 236 and method 230 repeats until the transmitted powers for a range of currents Ibias and Imod have been determined. Thereafter in operation, the host or controller 43 can instruct controller 16 to use values of currents Ibias and Imod that produce the desired transmitted powers.

Referring back to FIG. 1, laser system 100 may include an RX circuit 270 that decodes a light signal received from a fiber 272. A light detector 274 (e.g., a photodiode) outputs to RX circuit 270 an analog current signal IN1 proportional to the optical power of the light signal. RX circuit 270 converts current signal IN1 to voltage data signal OUT_P and its complement OUT_N. RX circuit 270 also outputs signals IPINAVG and RX_OMA to controller 43. Signal IPINAVG is proportional to the average optical power of the light signal. Signal RX_OMA is proportional to the received OMA of the light signal.

Figure 8:
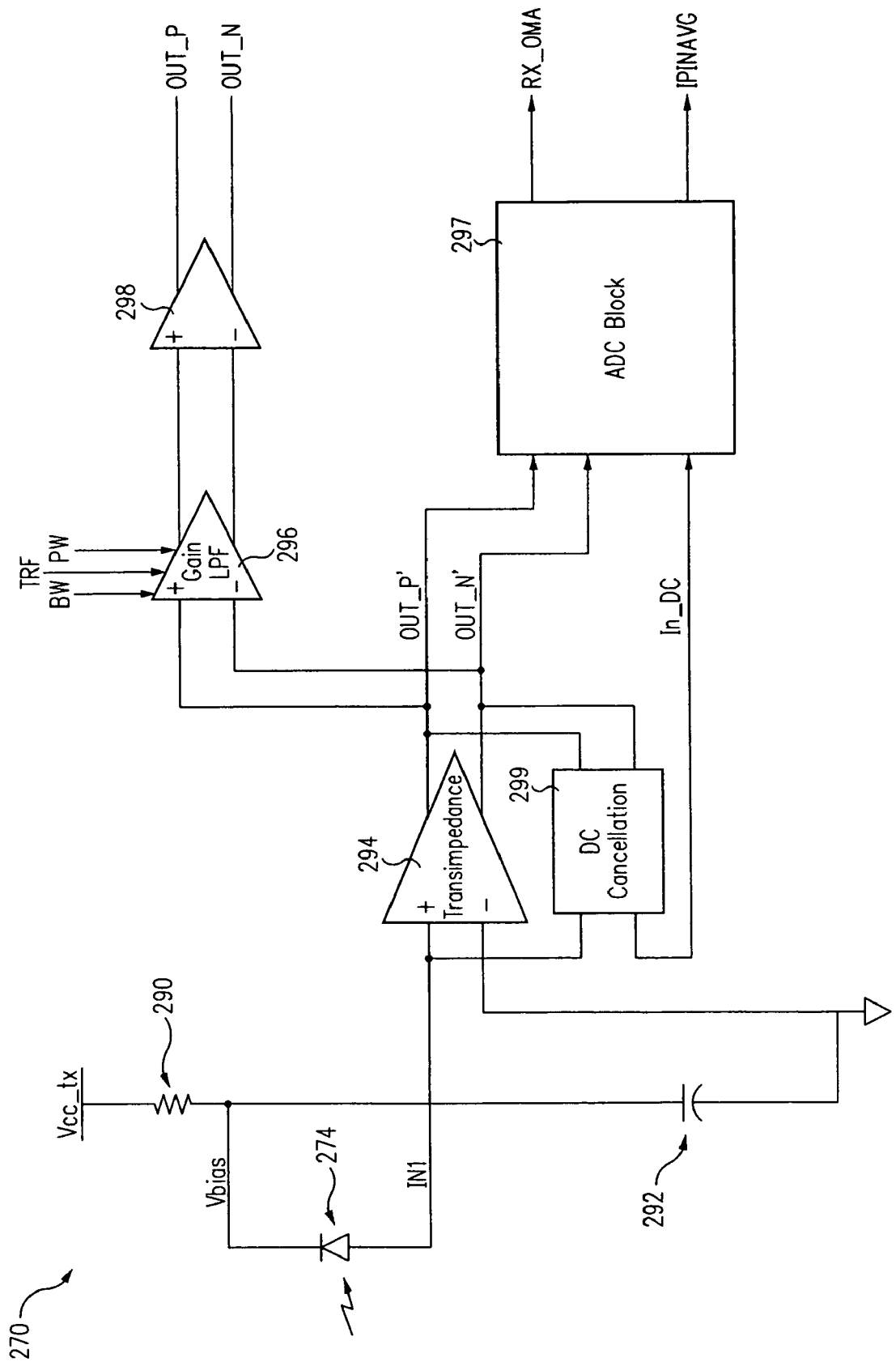
FIG. 8 is a schematic of a receiver (RX) circuit in the laser system of FIG. 1 in one embodiment.

FIG. 8 illustrates one embodiment of RX circuit 270. A resistor 290 and a capacitor 292 form an RC filter that provides a filtered voltage Vbias to photodiode 274. Photodiode 274 outputs signal IN1 to the non-inverted terminal of a transimpedance amplifier (TIA) 294. TIA 294 has the inverted terminal coupled to the ground as a reference.

TIA 294 converts current signal IN1 to a voltage signal OUT_P' and its complement OUT_N'. TIA 294 outputs signals OUT_P' and OUT_N' to an ampilfier 296 and an ADC block 297. Amplifier 296 outputs amplified signal OUT_P and its complement OUT_N to the host. Additional gain stages 298 may be used to further amplify signals OUT_P and OUT_N.

TIA 294 includes a DC cancellation circuit 299 that feeds back a DC cancellation current to the non-inverted terminal of amplifier 294. The DC cancellation current is proportional to the average optical power of the light signal received by photodiode 274. DC cancellation circuit 299 also includes a current mirror that mirrors the DC cancellation current and outputs it as a signal In_DC to ADC block 297.

Figure 9:
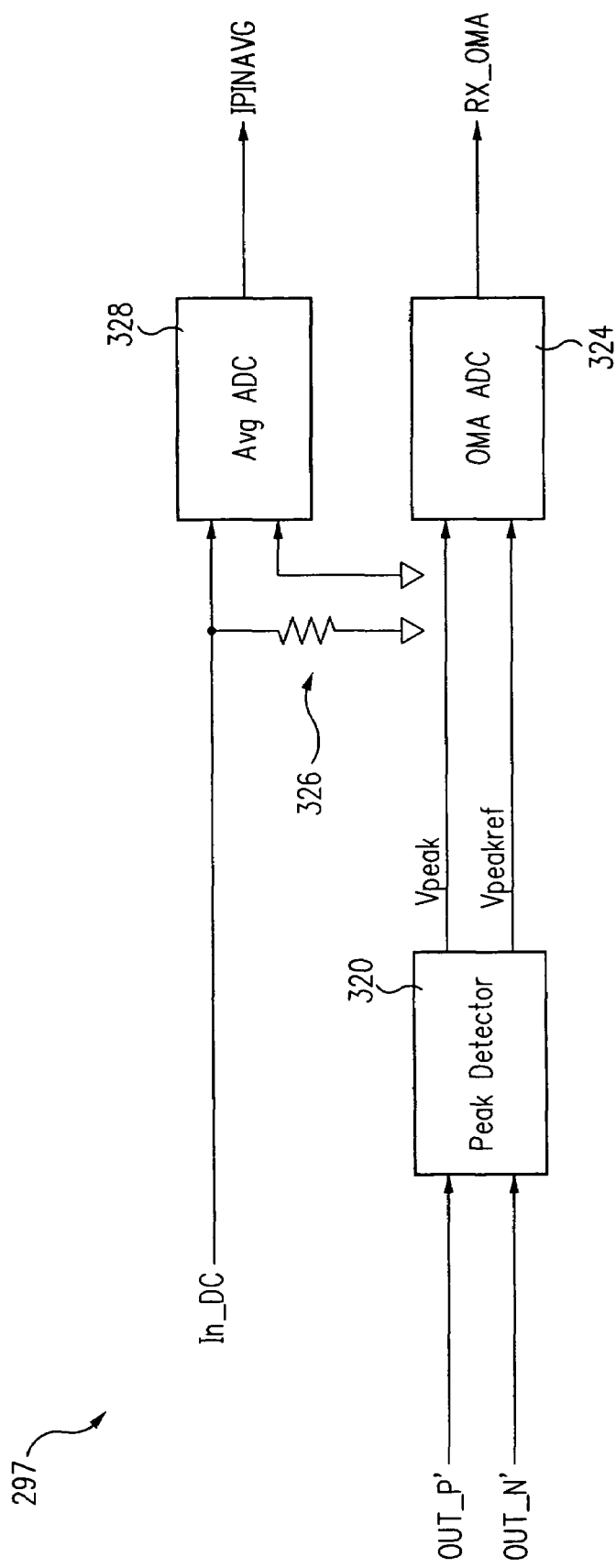
FIG. 9 is a schematic of an analog-to-digital (ADC) block in the RX circuit of FIG. 8 in one embodiment.

FIG. 9 illustrates one embodiment of ADC block 297. ADC block 297 includes a peak detector 320 coupled to receive signals OUT_P' and OUT_N'. Peak detector 320 outputs an analog signal Vpeak that is proportional to the peak level of signals OUT_P' and OUT_N', which is proportional to the received OMA of the light signal. Peak detector 320 also outputs a reference signal Vpeakref derived from signals OUT_P' and OUT_N'.

An OMA ADC 324 converts signal Vpeak to a digital signal RX_OMA. OMA ADC 324 receives signal Vpeakref as a reference signal. Current signal In_DC is forced through a resistor 326 to generate an input voltage signal to an average ADC 328. Average ADC 328 converts the input voltage signal to a digital signal IPINAVG. Average ADC 328 has a reference terminal coupled to ground.

Figure 9A:
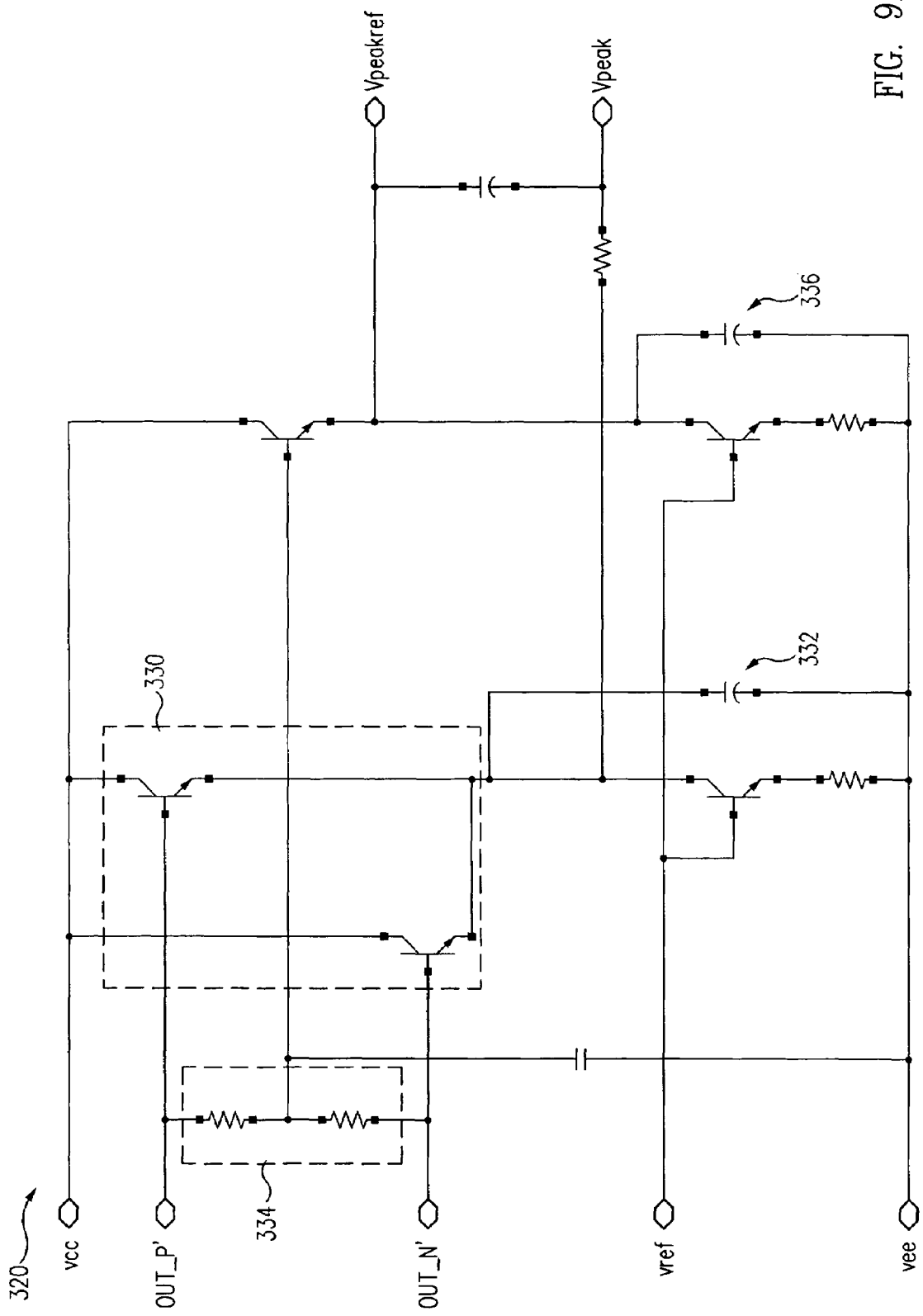
FIG. 9A is a schematic of a peak detector in the ADC block of FIG. 9 in one embodiment.

FIG. 9A illustrates one embodiment of peak detector 320. Peak detector 320 includes a differential pair 330 that selectively passes signals OUT_P' and OUT_N' to a holding capacitor 332. Holding capacitor 332 captures the highest voltage output from differential pair 330, which is the peak voltage of signals OUT_P' and OUT_N' level-shifted one base emitter junction voltage drop. The peak voltage is provided as signal Vpeak.

A voltage divider 334 is coupled between lines that carry signals OUT_P' and OUT_N'. Voltage divider 334 outputs the average of their voltages to a holding capacitor 336. Holding capacitor 336 captures the highest voltage output from voltage divider 334 level-shifted one base emitter junction voltage drop, which is provided as reference signal Vpeakref.

Figure 10:
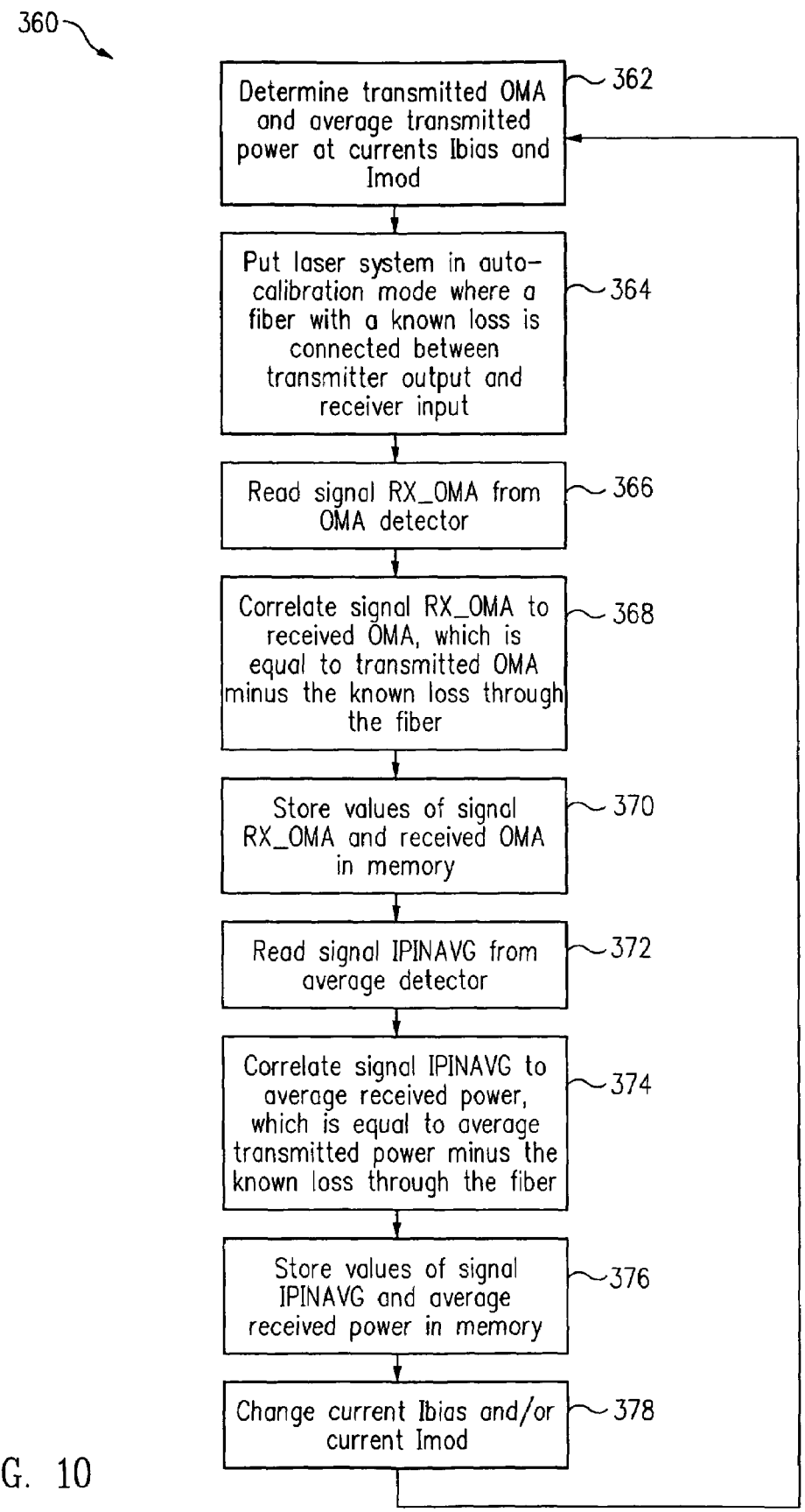
FIG. 10 is a flow chart of a method to measure received powers by the laser system of FIG. 1 in one embodiment.

In accordance with one aspect of the invention, a calibration fiber with a known loss is used to couple the output and the input of laser system 100 to measure the received OMA and the average received power Pavg_rx. FIG. 10 is a flow chart of a method 360 implemented by controller 43 to measure the received OMA and power Pavg_rx in one embodiment.

In step 362, controller 43 determines the transmitted OMA and average transmitted power Pavg_tx for given values of currents Ibias and Imod. Controller 43 can determine the transmitted OMA and power Pavg_tx with method 230 (FIG. 7) described above.

In step 364, the calibration fiber is connected between the output and the input of laser system 100 and modulated signals IN_P and IN_N with a balanced pattern is provided either externally or internally. Thus, fibers 36 and 272 (FIG. 1) are part of the same calibration fiber. Laser system 100 is then put into an auto-calibration mode.

In step 366, controller 43 reads the value of signal RX_OMA from OMA ADC 324 (FIG. 9).

In step 368, controller 43 determines the received OMA. The received OMA is equal to the determined transmitted OMA minus the known loss through the calibration fiber.

In step 370, controller 43 stores the value of signal RX_OMA and the corresponding value of the received OMA in a table 52 (FIG. 3A) in memory 46.

In step 372, controller 43 reads the value of signal INPINAVG from average ADC 328 (FIG. 9).

In step 374, controller 43 determines the average received power Pavg_rx. Power Pavg_rx is equal to the average transmitted power Pavg_tx minus the known loss through the calibration fiber.

In step 376, controller 43 stores the value of signal INPINAVG and the corresponding value of power Pavg_rx in a table 53 (FIG. 3A) in memory 46.

In step 378, controller 43 instructs controller 16 to change (e.g., increase) the value of current Ibias and/or the value of current Imod. Step 378 is followed by step 362 and method 360 is repeated for a range of currents Ibias and Imod to calibrate the measurement of the received OMA and power Pavg_rx.

Figure 11:
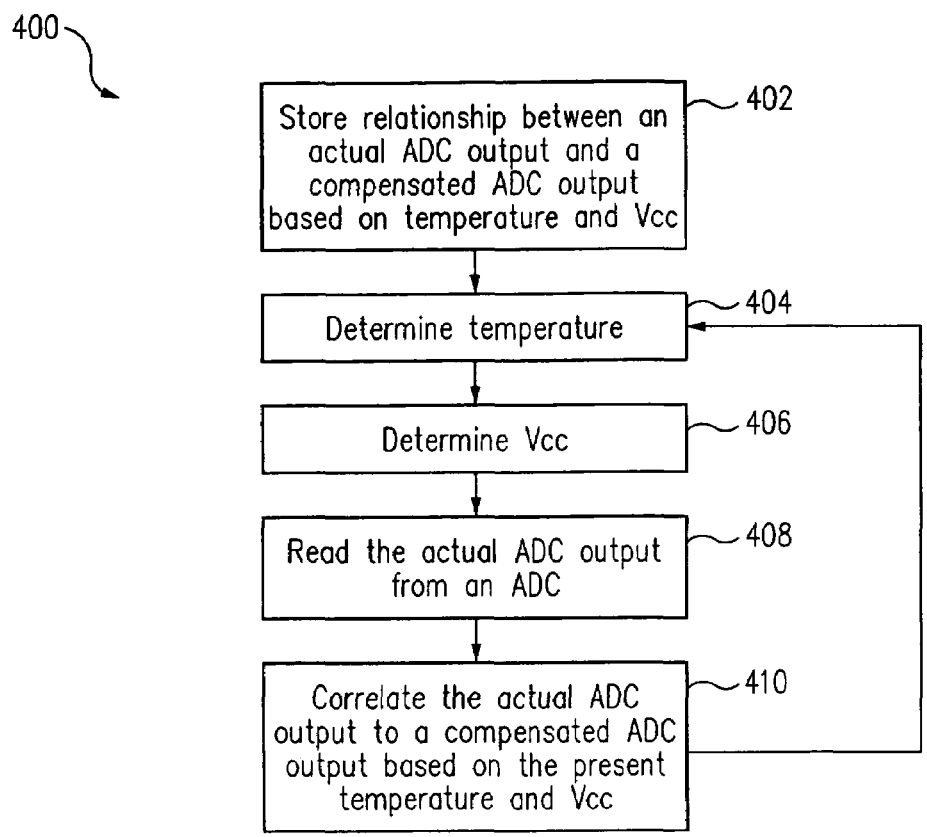
FIG. 11 is a flow chart of a method to compensate a variability of ADCs in the laser system of FIG. 1 in one embodiment.

In accordance with one aspect of the invention, the dependence of an ADC on temperature and supply voltage is compensated. The ADC that can be compensated includes Imon ADC 38 (FIG. 1), OMA ADC 324 (FIG. 9), average ADC 328 (FIG. 9), and other ADCs in system 100. FIG. 11 is a flowchart of a method 400 implemented by a controller to compensate the dependence of the ADC on temperature and supply voltage in one embodiment. Method 400 can also compensate the dependencies of a device source (e.g., a sensor) that generates the ADC input when they are calibrated together.

In step 402, compensated ADC outputs corresponding to actual ADC outputs for a range of temperatures and/or supply voltages are stored in a table 54 (FIG. 3A) in memory 46. The compensated ADC outputs are calibrated by providing known analog inputs to the ADC and recording the actual ADC outputs for a range of temperatures and/or supply voltages. For example, a light signal with a known power can be provided to photodiode 274. The actual ADC outputs of ADC 324 are recorded for the range of temperatures and/or supply voltages. These values are stored in table 54 with a compensated ADC output that represents the known power. The process is then repeated for other known powers. Instead of table 54, a function correlating the compensated ADC outputs to the actual ADC outputs for the range of temperatures and/or supply voltages can be extrapolated from experimental data and stored in memory 46.

In step 404, the controller reads the present temperature.

In step 406, the controller reads the present supply voltage.

In step 408, the controller reads the actual ADC output.

In step 410, the controller correlates the actual ADC output at the present temperature and/or supply voltage to a compensated ADC output. The controller can look up the compensated ADC output in table 54 based on the actual ADC output, the present temperature, and the present supply voltage. Alternatively, the controller can calculate the compensated ADC output using the function extrapolated from experimental data. The compensated ADC output is then used by any controller to operate laser system 100.

Figure 12:
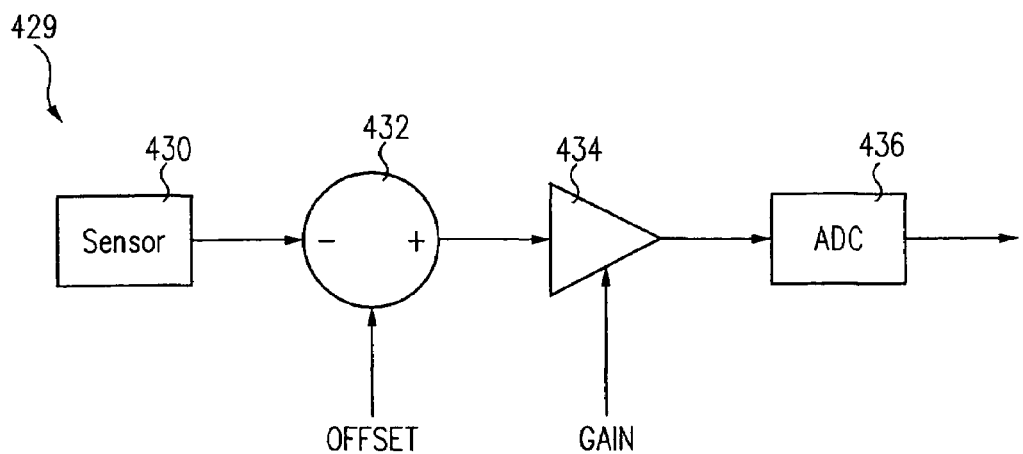
FIG. 12 is a schematic of a circuit that compensates the variability of ADCs in the laser system of FIG. 1 in one embodiment.

FIG. 12 illustrates a circuit 429 for compensating the dependence of an ADC on temperature and supply voltage in one embodiment. Circuit 429 can be used with any ADCs in laser system 100. A sensor 430 outputs an analog voltage signal to a programmable voltage offset circuit 432 (e.g., an R2R circuit). R2R circuit 432 outputs a voltage signal to a programmable amplifier 434. R2R circuit 432 can be programmed by the controller to add a specific voltage offset to its output signal. Programmable amplifier 434 outputs an amplified voltage signal to an ADC 436. Programmable amplifier 434 can be programmed by the controller to amplify its output signal with a specific gain.

The voltage offset and gain are used to compensate the temperature and supply voltage dependencies of ADC 436. Values of the voltage offset and gain can be calibrated by providing a known input to sensor 430 and adjusting the voltage offset and the gain for a range of temperatures and supply voltages so the ADC output is consistent for the same input. All the values are saved in a table 56 (FIG. 3A) in memory 46. The process is then repeated for other known inputs. Instead of table 56, a function can be extrapolated from the experimental data and stored in memory 46. In operation, the controller will read the values of the temperature and the supply voltage. Depending on the temperature and the supply voltage, the controller will provide the appropriate voltage offset and gain to R2R circuit 432 and amplifier 434, respectively.

Figure 13:
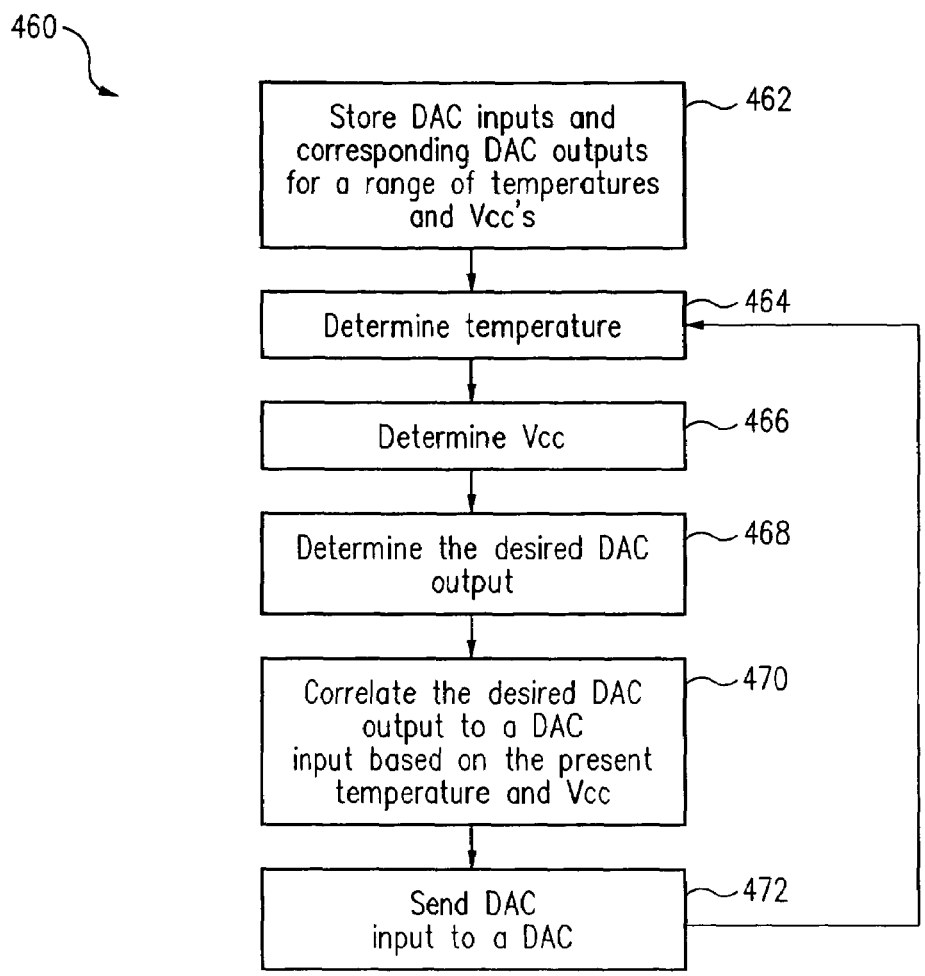
FIG. 13 is a flow chart of a method to compensate a variability of DACs in the laser system of FIG. 1 in one embodiment.

In accordance with one aspect of the invention, the dependence of a DAC on temperature and supply voltage is compensated. The DAC that can be compensated includes DAC 130 (FIG. 5), a DAC (not shown) in current source 26 (FIG. 2) in modulation driver 18, and other DACs in laser system 100. FIG. 13 is a flowchart of a method 460 implemented by a controller to compensate the dependence of the DAC on temperature and supply voltage in one embodiment. Method 460 can also compensate the dependencies of a device (e.g., a V/I converter) receiving the DAC output when they are calibrated together.

In step 462, DAC inputs and corresponding DAC outputs for a range of temperatures and supply voltages are stored in a table 58 in memory 46. A DAC input can be calibrated by measuring the corresponding DAC outputs for a range of temperatures and supply voltages. The DAC input and the corresponding DAC outputs for these temperatures and supply voltages are saved. The above steps are then repeated for other DAC inputs. Instead of table 58, a function can be extrapolated from experimental data and stored in memory 46.

In step 464, the controller reads the present temperature.

In step 466, the controller reads the present supply voltage.

In step 468, the controller determines the desired DAC output.

In step 470, the controller correlates the desired DAC output at the present temperature and supply voltage to a DAC input. The controller can look up the DAC input in table 58. Alternatively, the controller can calculate the DAC input using the function extrapolated from experimental data.

In step 472, the controller provides the DAC input to the DAC.

Figure 14:
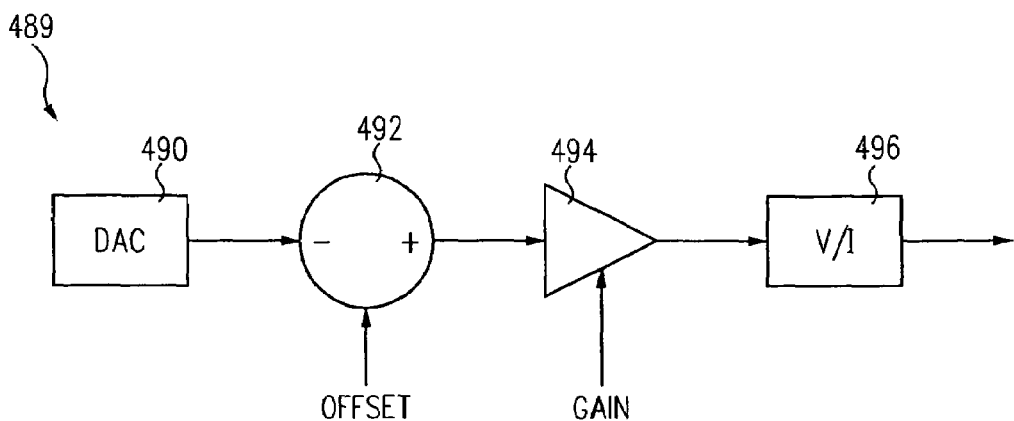
FIG. 14 is a schematic of a circuit that compensates the variability of DACs in the laser system of FIG. 1 in one embodiment.

FIG. 14 illustrates a circuit 489 for compensating the dependence of a DAC on temperature and supply voltage in one embodiment. A DAC 490 outputs an analog voltage signal to a programmable offset circuit 492 (e.g., an R2R circuit). R2R circuit 492 outputs a voltage signal to an amplifier 494. R2R circuit 492 can be programmed by the controller to add a specific voltage offset to its output signal. Amplifier 494 outputs an amplified voltage signal to a device 496 (e.g., a V/I converter). Amplifier 494 can be programmed by the controller to amplify its output signal with a specific gain.

The voltage offset and gain are used to compensate the temperature and supply voltage dependencies of the DAC. Values of the voltage offset and gain can be calibrated by providing an input to DAC 490 and adjusting the voltage offset and the gain for a range of temperatures and supply voltages so the output of device 496 is consistent for the same input. The process is then repeated for other DAC inputs. All the values are saved in a table 60 (FIG. 3A) in memory 46. Instead of table 60, a function can be extrapolated from the experimental data and stored in memory 46. In operation, the controller will read the temperature and supply voltage. Depending on the temperature and supply voltage, the controller will provide the appropriate voltage offset and gain to R2R circuit 492 and amplifier 494, respectively.

Referring back to FIG. 1, laser system 100 may include amplifier 28 with a programmable low-pass filter to adjust the bandwidth of data signals IN_P and IN_N. Controller 43 outputs a control signal BW to amplifier 28 to set the frequency response of the low-pass filter. Control signal BW can be a digital signal with multiple bits. Control signal BW is stored in memory 46. The host writes to memory 46 to change the value of control signal BW to compensate the variations of laser system 100 between parts and over temperature.

Figure 15:
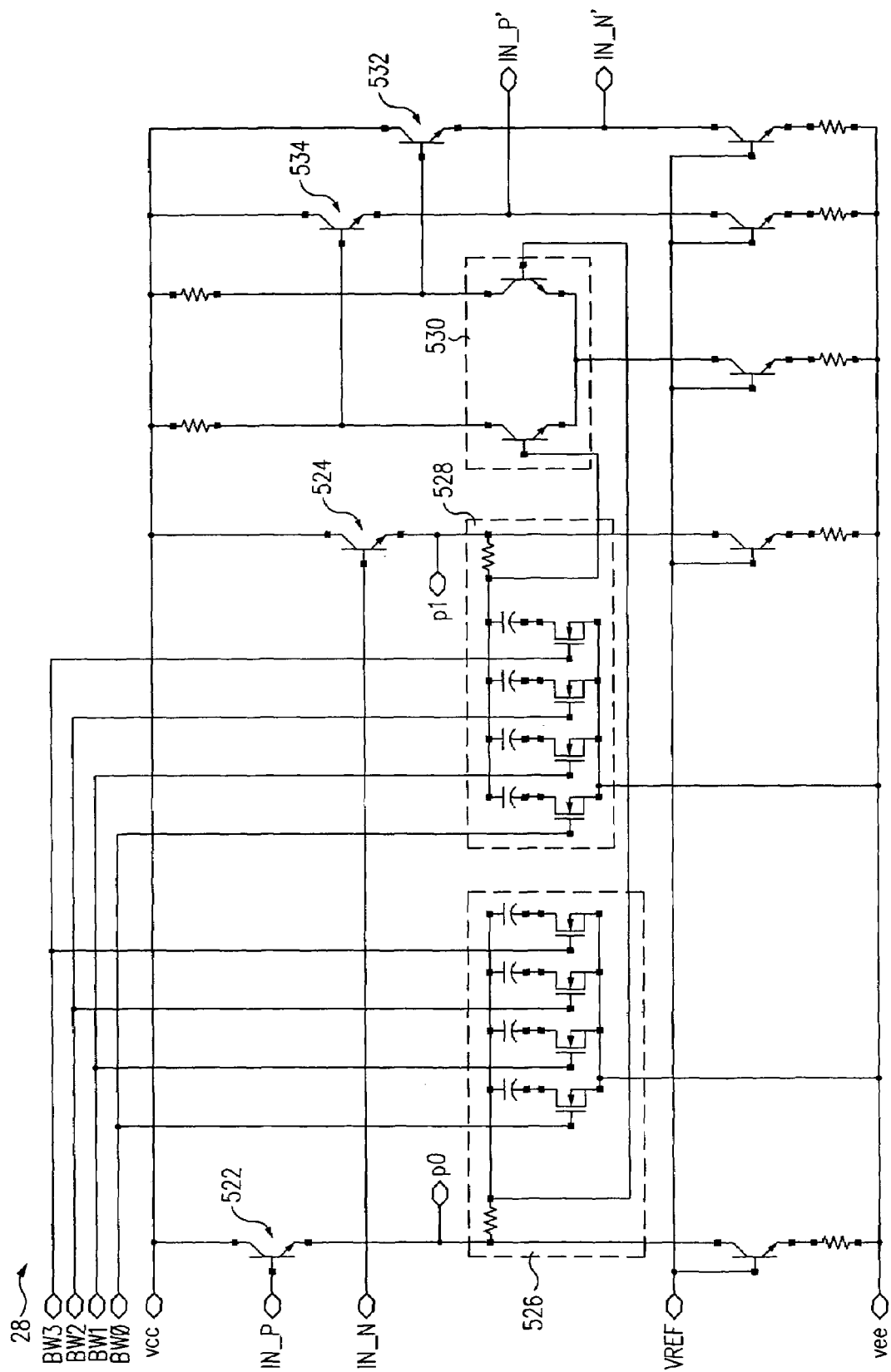
FIGS. 15 and 16 are schematics of a gain amplifier in the laser system of FIG. 1 in two embodiments.

FIG. 15 illustrates one embodiment of amplifier 28 with the programmable low-pass filter. Data signals IN_P and IN_N are level-shifted by transistors 522 and 524, respectively. Data signals IN_P and IN_N are then filtered by RC filters 526 and 528, respectively. The capacitance of RC filter 526 can be adjusted by changing the number of capacitors C0 to C3 that are coupled in parallel by NMOS transistors M4 to M7. Similarly, the capacitance of RC filter 528 can be adjusted by changing the number of capacitors C4 to C7 that can be coupled in parallel by NMOS transistors M0 to M3. NMOS transistors M0 to M7 are controlled by control signals BW0 to BW3 (collectively called "control signal BW") from controller 43. The outputs from RC filters 526 and 528 are passed to a differential pair 530 that selectively outputs the filtered data signals, which are then level-shifted again by transistors 532 and 534, respectively.

Figure 16:
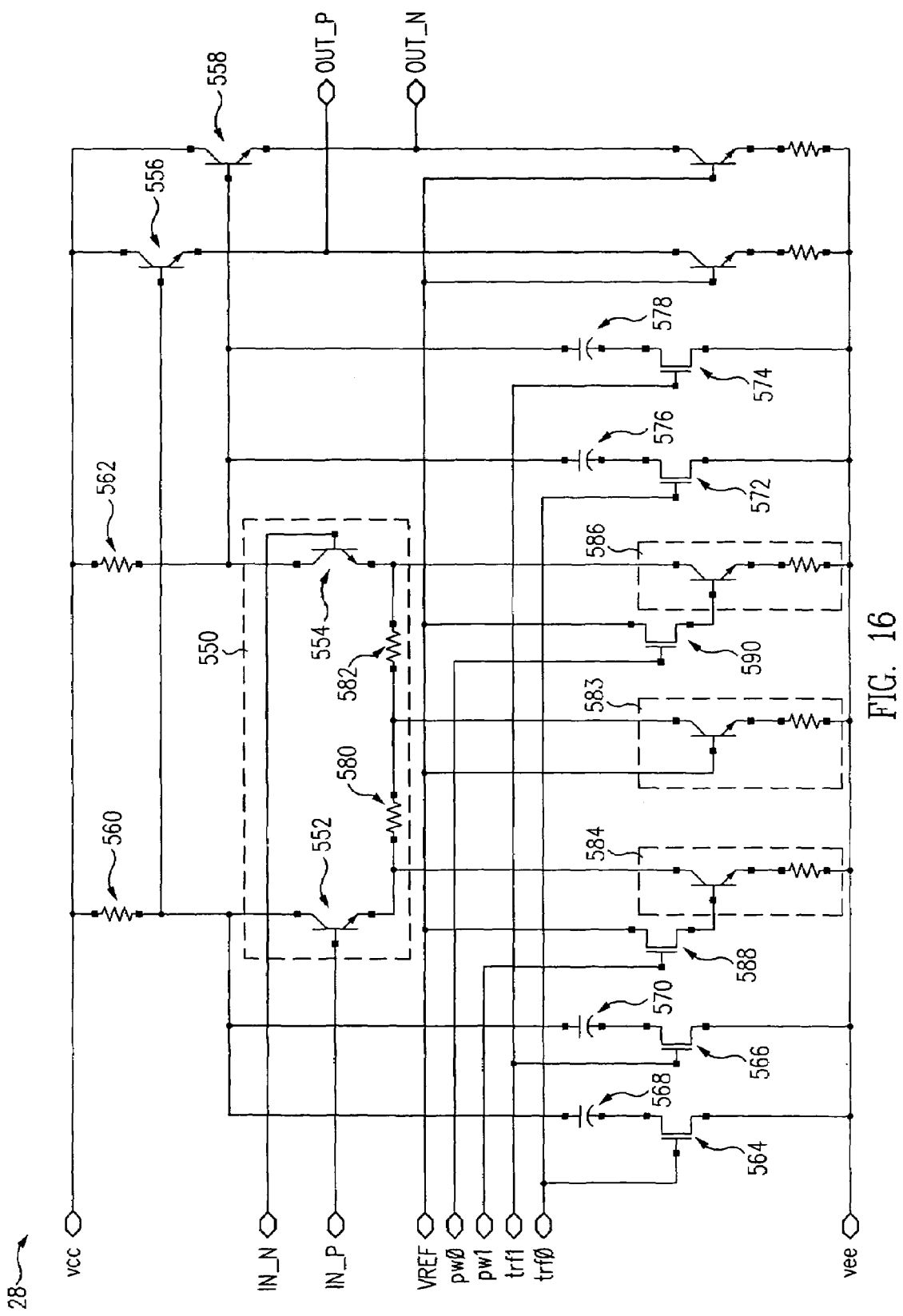

FIG. 16 illustrates another embodiment of amplifier 28 with rise/fall time and pulse width adjustment circuitry. Data signals IN_N and IN_P are selectively passed out by a differential pair 550 formed by bipolar transistors 552 and 554. The data signals are then level-shifted by bipolar transistors 556 and 558 as data signals OUT_P and OUT_N.

Resistors 560 and 562 set the base voltages applied to transistors 556 and 558, respectively. NMOS transistors 564 and 566 can be turned on to couple capacitors 568 and 570 to resistor 560. This adds additional capacitance to resistor 560 and slows down the rise and fall times of signal OUT_P. Similarly, NMOS transistors 572 and 574 can be turned on to couple capacitors 576 and 578 to resistor 562. This slows down the rise and fall times of signal OUT_P OUT_N. Transistors 564, 566, 572, and 574 are turned on by control signals trf1 and trf0 (shown collectively as "control signal TRF" in FIG. 1).

Currents from the emitter terminals of transistors 552 and 554 are sunk through resistors 580 and 582 by a current source 583. The input threshold of transistors 552 and 554 of differential pair 550 can be changed by turning on additional current sources 584 and 586 coupled to the emitter terminals of transistors 552 and 554. This causes transistors 552 and 554 to be turned on faster or slower, thereby changing the pulse width of signals OUT_P and OUT_N. Transistors 588 and 590 turn on current sources 584 and 586, respectively, in response to control signals pw1 and pw0 (shown collectively as "control signal PW" in FIG. 1).

Control signals TRF and PW can be stored in memory 46. The host writes to memory 46 to change the value of control signals TRF and PW to compensate the variations of laser system 100 between parts, over time, and over temperature.

As understood by one skilled in the art, the embodiments of amplifier 28 in FIGS. 15 and 16 can be combined into a single amplifier 28 to provide bandwidth, rise and fall time, and pulse width adjustment.

Laser system 100 may also include amplifier 296 (FIG. 8) that includes circuitry for adjusting the bandwidth, the rise and fall time, and the pulse width of the received data signals OUT_P' and OUT_N'. Amplifier 296 can be similarly constructed as amplifier 28 described above.

Various other adaptations and combinations of features of the embodiments disclosed are within the scope of the invention. For example, modulation drivers which are AC-coupled from the driver to the laser, either single-ended thru one capacitor, or differentially thru two capacitors, may be utilized in some systems. Without special circuits the same technique to set the drive current to the logic zero and logic one values do not work as the dc signal Imod would be blocked by the capacitors. In the AC-coupled driver case, the prior circuit described is still effective to capture IMON (AVG) and Pavg_tx as previously described. In order to measure IMON(LOW), IMON(HIGH) and correlate to P0, P1, TX_OMA, an additional driver circuit is necessary to provide the same modulation currents as the AC coupled driver, but connected to add the current direct-coupled to the Ibias current source 14. In normal operation this circuit would be inactivated. Numerous embodiments are encompassed by the following claims.

What is claimed is:

1. A method for laser system to determine a condition of the laser system, comprising:
    generating a temperature signal corresponding to a temperature of a laser;
    generating a supply voltage signal corresponding to a supply voltage to the laser system;
    determining a present value of a current to the laser;
    determining a preset value of the current based on the temperature signal and the supply voltage signal; and
    determining a change in the current, wherein the change in the current indicates the condition.

2. The method of claim 1, wherein said determining a preset value of the current comprises using a relationship of values of the current, the temperature signal, and the supply voltage signal in a memory, the relationship is stored in a manner selected from the group consisting of a table and a function.

3. The method of claim 1, wherein said determining a change in the current comprises a step selected from the group consisting of calculating a difference between the present value and the preset value of the current, and calculating a ratio between the present value and the initial value of the current.

4. The method of claim 1, wherein said determining a present value of a current comprises adjusting the present value of the current according to a difference between a reference signal and a feedback signal proportional to an output power of the laser.

5. The method of claim 1, wherein the condition is selected from the group consisting of a degradation of the laser system and a malfunction of the laser system.

6. The method of claim 1, further comprising outputting the change in the current to a host.

7. A laser system, comprising:
    a memory, the memory storing a relationship between a plurality of preset values of a current to a laser for a first plurality of values of a temperature signal and a second plurality of values of a supply voltage signal, the supply voltage signal corresponding to a supply voltage to the laser system;
    a controller, the controller being coupled to receive (1) the temperature signal, (2) the supply voltage signal, (3) a preset value of the current from the memory based on the temperature signal and the supply voltage signal, the controller being programmed to determine a change in the current.

8. The laser system of claim 7, wherein the relationship is stored in a manner selected from the group consisting of a table and a function.

* * * * *